(12) United States Patent
Choi et al.

(10) Patent No.: US 10,714,653 B2
(45) Date of Patent: Jul. 14, 2020

(54) COMPOUND SEMICONDUCTOR SOLAR CELL AND METHOD OF MANUFACTURING THE SAME

(71) Applicant: LG ELECTRONICS INC., Seoul (KR)

(72) Inventors: Wonseok Choi, Seoul (KR); Gunho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/959,974

(22) Filed: Apr. 23, 2018

(65) Prior Publication Data
US 2018/0309017 A1 Oct. 25, 2018

(30) Foreign Application Priority Data
Apr. 24, 2017 (KR) .................. 10-2017-0052520

(51) Int. Cl.
| | | |
|---|---|---|
| *H01L 31/18* | (2006.01) | |
| *H01L 31/0735* | (2012.01) | |
| *H01L 31/0304* | (2006.01) | |
| *H01L 31/0687* | (2012.01) | |
| *H01L 31/068* | (2012.01) | |
| *H01L 31/0693* | (2012.01) | |
| *H01L 31/0725* | (2012.01) | |

(52) U.S. Cl.
CPC .... *H01L 31/1844* (2013.01); *H01L 31/03042* (2013.01); *H01L 31/03046* (2013.01); *H01L 31/068* (2013.01); *H01L 31/0687* (2013.01); *H01L 31/0693* (2013.01); *H01L 31/0725* (2013.01); *H01L 31/0735* (2013.01); *Y02E 10/544* (2013.01); *Y02P 70/521* (2015.11)

(58) Field of Classification Search
CPC ....................... H01L 31/0304–03928
USPC ................................. 136/243–265
See application file for complete search history.

(56) References Cited

U.S. PATENT DOCUMENTS

| | | | | |
|---|---|---|---|---|
| 4,057,476 A | * | 11/1977 | Krikorian | ............... C30B 23/02 257/188 |
| 6,281,426 B1 | * | 8/2001 | Olson | ............... H01L 31/03046 136/249 |
| 2012/0080082 A1 | * | 4/2012 | Suh | ................... H01L 31/03042 136/255 |

FOREIGN PATENT DOCUMENTS

| | | |
|---|---|---|
| JP | 2005-167264 A | 6/2005 |
| JP | 2010-226061 A | 10/2010 |
| KR | 10-2012-0022970 A | 3/2012 |
| KR | 10-2012-0034965 A | 4/2012 |

(Continued)

*Primary Examiner* — Niki Bakhtiari
(74) *Attorney, Agent, or Firm* — Birch, Stewart, Kolasch & Birch, LLP

(57) ABSTRACT

Disclosed is a method of manufacturing a compound semiconductor solar cell according to an embodiment of the invention. The method of manufacturing the compound semiconductor solar cell according to the embodiment of the invention includes forming a plurality of compound semiconductor layers of at least two elements and including a base layer and an emitter layer, the base layer including a first conductivity type dopant to have a first conductivity type and the emitter layer including a second conductivity type dopant to have a second conductivity type. The forming of the plurality of compound semiconductor layers includes at least one of a process-temperature change period and a growth-rate change period.

15 Claims, 11 Drawing Sheets

(56) References Cited

FOREIGN PATENT DOCUMENTS

KR   10-2014-0078784 A   6/2014

\* cited by examiner (a)

(b)

(c)

(d)

COMPOUND SEMICONDUCTOR SOLAR CELL AND METHOD OF MANUFACTURING THE SAME

CROSS-REFERENCE TO RELATED APPLICATION

This application claims priority to and the benefit of Korean Patent Application No. 10-2017-0052520, filed in the Korean Intellectual Property Office on Apr. 24, 2017, the entire contents of which are incorporated herein by reference.

BACKGROUND OF THE INVENTION

Field of the Invention

Embodiments of the invention relate to a compound semiconductor solar cell and a method of manufacturing the same, and, more particularly, to a compound semiconductor solar cell manufactured by an improved process and a method of manufacturing the same.

Description of the Related Art

Recently, as energy resources such as oil and coal are expected to be depleted, interest in alternative energy to replace them is increasing. Among them, solar cells which convert solar energy into electric energy are attracting attention as a next generation battery.

In such solar cells, various layers and electrodes may be manufactured by design. Efficiency of a solar cell may be determined by the design of these various layers and electrodes. In order to commercialize a solar cell, various layers and electrodes are required to be manufactured so as to improve productivity and reliability of the solar cell.

For example, in a compound semiconductor solar cell formed by stacking compound semiconductor layers, a doping concentration and a doping profile may be different from those designed by a diffusion of unwanted dopants. In such a case, open-circuit voltage and a fill factor of the compound semiconductor solar cell may be lowered and the efficiency may be lowered.

SUMMARY OF THE INVENTION

Therefore, embodiments of the invention have been made in view of the above problems, and embodiments of the invention are to provide a compound semiconductor solar cell having excellent efficiency and a method of manufacturing the solar cell.

A method of manufacturing a compound semiconductor solar cell according to an embodiment of the invention includes forming a plurality of compound semiconductor layers of at least two elements, and including a base layer and an emitter layer, the base layer including a first conductivity type dopant to have a first conductivity type and the emitter layer including a second conductivity type dopant to have a second conductivity type. The forming of the plurality of compound semiconductor layers includes at least one of a process-temperature change period and a growth-rate change period.

A compound semiconductor solar cell according to an embodiment of the invention includes a base layer including a first conductivity type dopant to have a first conductivity type; and an emitter layer on the base layer, and including a second conductivity type dopant to have a second conductivity type. Each of the base layer and the emitter layer includes a compound semiconductor layer of at least two elements. A doping concentration of the second conductivity type dopant in the emitter layer is at least 10 times a doping concentration of the second conductivity type dopant in the base layer.

In a method of manufacturing a compound semiconductor solar cell according to an embodiment of the invention, by controlling a process temperature and/or a growth rate in a process of forming a photoelectric conversion unit, the photoelectric conversion unit can be formed to have a desired doping concentration and a desired doping profile. As a result, a compound semiconductor solar cell including the photoelectric conversion unit has excellent open-circuit voltage and a high fill factor, and thus, can have high efficiency.

DETAILED DESCRIPTION OF THE EMBODIMENTS

Figure 1:
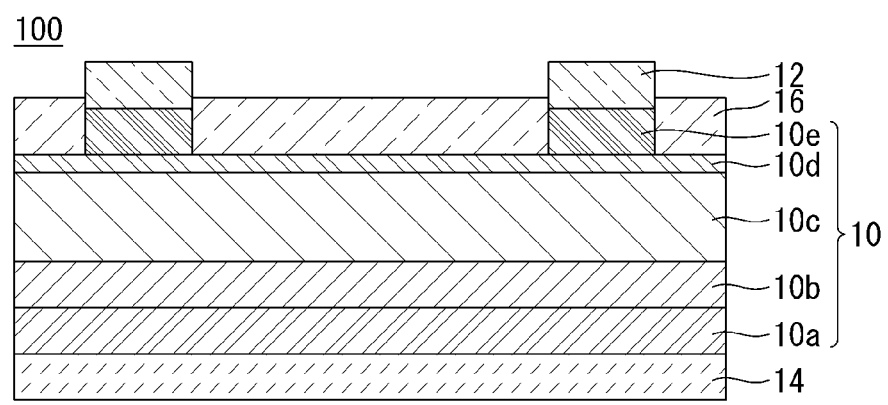
FIG. 1 is a cross-sectional view schematically showing an example of a compound semiconductor solar cell according to an embodiment of the invention.

Hereinafter, embodiments of the invention will be described in detail with reference to accompanying drawings. However, embodiments of the invention are not limited thereto, and may be modified to other various embodiments.

In the drawings, illustration of portions unrelated to descriptions is omitted for clarity and simplicity. The same reference numerals designate the same or very similar elements throughout the specification. In the drawings, thicknesses, widths or the like of elements are exaggerated or reduced for clarity of descriptions, and thus, embodiments of the invention are not limited to the thickness, widths, or the like.

It will be understood that terms "comprise" and/or "comprising," or "include" and/or "including" used in the specification do not preclude a presence or addition of one or more other elements. In addition, it will be understood that, when an element such as a layer, film, region, or plate is referred to as being "on" another element, it may be disposed "directly on" another element or may be disposed such that an intervening element is also present therebetween. Accordingly, when an element such as a layer, film, region, or plate is disposed "directly on" another element, this means that there is no intervening element between the elements.

Hereinafter, a compound semiconductor solar cell and a method of manufacturing the same according to an embodiment of the invention will be described in detail with reference to the accompanying drawings. FIG. 1 is a cross-sectional view schematically showing an example of a compound semiconductor solar cell according to an embodiment of the invention.

Referring to FIG. 1, a compound semiconductor solar cell 100 according to an embodiment includes a photoelectric conversion unit (hereinafter, referred to as a first photoelectric conversion unit) 10 including a plurality of compound semiconductor layers 10a, 10b, 10c, 10d, and 10e. The plurality of compound semiconductor layers 10a, 10b, 10c, 10d and 10e include a base layer 10c and an emitter layer 10b having different conductivity types to form a pn junction, and may further include a back surface field layer 10a, a window layer 10d, and a contact layer 10e. The compound semiconductor solar cell 100 may further include a first electrode 12 electrically connected to the base layer 10c on a surface (for example, a front surface), and a second electrode 12 electrically connected to the emitter layer 10b on the other surface (for example, a back surface), an anti-reflection layer 16, and the like. This will be described in more detail.

Hereinafter, it is exemplified that the plurality of compound semiconductor layers 10a, 10b, 10c, 10d, and 10e include the back surface field layer 10a, the emitter layer 10b, the base layer 10c, the window layer 10d, and the contact layer 10e, which are sequentially stacked. Thus, the back surface field layer 10a, the emitter layer 10b, the base layer 10c, the window layer 10d, the contact layer 10e, and the first electrode 12 are sequentially formed on the second electrode 14. For example, adjacent two layers of them may be in contact with each other.

However, embodiments of the invention are not limited thereto. Therefore, at least one of the back surface field layer 10a, the window layer 10d, and the contact layer 10e may be not formed, and may further include another layer other than the above-described layers. For example, a buffer layer (not shown in the drawings) may be positioned between the emitter layer 10b and the base layer 10c. The buffer layer may have the same conductivity type as the base layer 10c and have a lower doping concentration than the base layer 10c. When the emitter layer 10b and the base layer 10c are formed of different materials and/or have different compositions, a material and/or a composition of the buffer layer may be gradually varied from a material and/or a composition the same as or similar to a material and/or a composition of the emitter layer 10b to a material and/or a composition the same as or similar to a material and/or a composition of the base layer 10c as it goes from the emitter layer 10b to the base layer 10c. Alternatively, another contact layer having a conductivity type opposite to that of the contact layer 10e and acting similar to the contact layer 10e may be included on a surface of the back surface field layer 10a opposite to the base layer 10c (for example, between the back surface field layer 10a and the second electrode 14). Various other variations are possible.

Each of the plurality of compound semiconductor layers 10a, 10b, 10c, 10d, and 10e may be formed of a compound semiconductor layer of a group III element and a group V element, and the plurality of compound semiconductor layers 10a, 10b, 10c, 10d, and 10e may have the same material or composition, or different materials of compositions. For example, gallium (Ga), indium (In), aluminum (Al), or the like may be used as a group III element, and phosphorus (P), arsenic (As), nitrogen (N), or the like may be used as a group V element. In particular, the base layer 10c may include a compound semiconductor including gallium, indium, and phosphorus. The compound semiconductor solar cell 100 based on the compound semiconductor layer of group III and V elements has a direct transition band gap, and thus, has a higher light absorption rate than the conventional silicon solar cell and have superior properties by covalent bond. Also, the plurality of compound semiconductor layers 10a, 10b, 10c, 10d, and 10e may be applied to a compound semiconductor solar cell 100 having a multi junction structure, and then, the compound semiconductor solar cell 100 can be manufactured by a simple process and have high efficiency.

The base layer 10c may substantially absorb light and be directly involved in photoelectric conversion. The base layer 10c may include a first conductivity type dopant to have a first conductivity type. In this instance, the base layer 10c may be a gallium-indium-phosphorous (GaInP) layer. When the base layer 10c includes the GaInP layer as described above, it has a high energy band gap and can effectively absorb light of short wavelengths to perform photoelectric conversion.

The window layer 10d positioned on (e.g., in contact with) the base layer 10c serves as a barrier for preventing movements of undesired carriers (electrons or holes), and serves as a passivation for preventing surface recombination. In this instance, when the window layer 10d has an energy band gap higher than that of the base layer 10c, the window layer 10d can effectively act as the barrier and light absorption at the window layer 10d can be minimized.

The window layer 10d may be doped with a first conductivity type dopant to have a first conductivity type as the base layer 10c, and a doping concentration of the first conductivity type dopant may be higher in the window layer 10d than in the base layer 10c. The window layer 10d may be formed of the same material as the base layer 10c or may be formed of a different material from the base layer 10c. In this instance, the window layer 10d may be formed of the different material from the base layer 10c to have an energy band gap higher than that of the base layer 10c. For example, the window layer 10d may include or be formed of an aluminum-indium-phosphorous (AlInP) layer or an aluminum-gallium-indium-phosphorous (AlGaInP) layer having a first conductivity type dopant. When the window layer 10d further includes aluminum, the energy band gap of the window layer 10d can be higher than that of the base layer 10c.

The contact layer 10e positioned on (e.g., in contact with) the window layer 10d serves to improve an ohmic contact property with the first electrode 12. The contact layer 10e may have a predetermined pattern corresponding to a shape of the first electrode 12. That is, the contact layer 10e may be partially formed only at a portion where the first electrode 12 is formed.

The contact layer 10e may be doped with a first conductivity type dopant to have a first conductivity type and a doping concentration of the first conductivity type dopant may be higher in the contact layer 10e than those of the base layer 10c and the window layer 10d. The contact layer 10e may include a material different from those of the back surface field layer 10a, the emitter layer 10b, the base layer 10c, and the window layer 10d. For example, the contact layer 10e may be formed of a material having a band gap lower than band gaps of the back surface field layer 10a, the emitter layer 10b, the base layer 10c, and the window layer 10d, to improve an ohmic contact property. As an example, the contact layer 10e may be a gallium-arsenide (GaAs) layer including a first conductivity type dopant.

The emitter layer 10b may include a second conductivity type dopant to have a second conductivity type opposite to the first conductivity type of the base layer 10c. The emitter layer 10b may be formed on (e.g., in contact with) the base layer 10c to form a pn junction with the base layer 10c. The emitter layer 10b may be formed of the same material having the same energy band gap as that of the base layer 10c except that the emitter layer 10b includes the second conductivity type dopant. Alternatively, the emitter layer 10b may be formed of a different material from the base layer 10c. For example, the emitter layer 10b may be formed of a gallium-indium-phosphorous (GaInP) layer or an aluminum-gallium-indium-phosphorous (AlGaInP) layer. When the emitter layer 10b is formed of a GaInP layer, the emitter layer 10b may have properties the same as or similar to the base layer 10c, thereby improving a pn junction property. When the emitter layer 10b is formed of an AlGaInP layer, the emitter layer 10b may have an excellent pn junction property since it is formed of a material similar to the base layer 10c, while energy band gap is increased by aluminum (Al) and thus movements of carriers can be effectively performed.

The back surface field layer 10a positioned between (for example, in contact with) the second electrode 14 and the emitter layer 10b is doped with a second conductivity type dopant to have a second conductivity type as the emitter layer 10b. A doping concentration of the second conductivity type dopant may be lower in the back surface field layer 10a than the emitter layer 10b. The back surface field layer 10a may be formed of the same material as the emitter layer 10b or the window layer 10d, or may be formed of a different material from the emitter layer 10b or the window layer 10d. For example, the back surface field layer 10a may be formed of an aluminum-indium-phosphorus (AlInP) layer or an aluminum-gallium-indium-phosphorus (AlGaInP) layer having a second conductivity type dopant. When the back surface field layer 10a includes aluminum, it has a large energy band gap and can effectively prevent the movement of unwanted carriers.

The back surface field layer 10a, the emitter layer 10b, the base layer 10c, and the window layer 10d may be entirely formed without having a predetermined pattern so as to sufficiently perform their respective roles.

The base layer 10c, the window layer 10d, and the contact layer 10e may be classified into a first conductivity type semiconductor layer including a first conductivity type dopant to have a first conductivity type, while the back surface field layer 10a and the emitter layer 10b may be classified as a second conductivity type semiconductor layer including a second conductivity type dopant to have a second conductivity type.

For example, the first conductivity type may be n-type, the first conductivity type dopant may be an n-type dopant, the second conductivity type may be p-type, and the second conductivity type dopant may be a p-type dopant. When the base layer 10c has an n-type, the base layer 10c has few defects and thus has a high quality. However, embodiments of the invention are not limited thereto, and conversely, the first conductivity type may be p-type and the second conductivity type may be n-type.

In this instance, the p-type dopant may include at least one of zinc, carbon, and magnesium, and the n-type dopant may include at least one of silicon, selenium, and tellurium. For example, when the p-type dopant includes zinc, doping can be stably performed. However, when zinc is used as the second conductivity type dopant included in the emitter layer 10b, the zinc may be easily diffused into the back surface field layer 10a and/or the base layer 10c in the following process and, it may cause problems. This will be described in detail later.

The first electrode 12 and the second electrode 14 may collect carriers generated by photoelectric conversion.

Each of the first and second electrodes 12 and 14 may include a conductive material (e.g., a metal) or a semiconductor material to collect carriers. Each of the first and second electrodes 12 and 14 may be formed of a single film or a multi-layered film including at least one of gold, silver, nickel, titanium, platinum, copper, palladium, molybdenum, germanium or an alloy including at least one of them.

As described above, the first electrode 12 may be positioned on (for example, in contact with) the front surface of the first photoelectric conversion unit 10 (for example, the front surface of the contact layer 10e) on which light is incident. Accordingly, the first electrode 12 may have a predetermined pattern so that light can be incident to the first photoelectric conversion unit 10. For example, the first electrode 12 may include a plurality of electrode portions extending in one direction to be parallel to each other and a bus bar electrode connecting the plurality of electrode portions in another direction crossing the plurality of electrode portions. The second electrode 14 may be positioned on (e.g., in contact with) the back surface of the first photoelectric conversion unit 10 (for example, the back surface of the back surface field layer 10a). The back electrode 14 may be a conductive layer of a sheet shape entirely formed without having a constant pattern. The back electrode 14 may be a sheet electrode.

The anti-reflection layer 16 may be positioned at a region other than a region where the first electrode 12 is positioned on the front surface of the window layer 10d to reduce reflection of light. However, embodiments of the invention are not limited thereto, and the anti-reflection layer 16 may be disposed on at least a part of the first electrode 12 (for example, on the plurality of electrode portions of the first electrode 12) as well as on the window layer 10d. The anti-reflection layer 16 may be a single film or a multi-layered film including at least one of magnesium fluoride, zinc sulfide, titanium oxide, and silicon oxide.

When light is incident to the compound semiconductor solar cell 100, electrons and holes are generated by photoelectric conversion of the first photoelectric conversion unit 10, and one of electrons and holes is collected by the first electrode 12 and the other of electrons and holes is collected by the second electrode 14 to generate electrical energy.

The first photoelectric conversion unit 10 has excellent efficiency when a doping concentration, a thickness, etc. of the plurality of compound semiconductor layers 10a, 10b, 10c, 10d, and 10e constituting the first photoelectric conversion unit 10 are within a predetermined range. This will be described in detail later in a method of manufacturing the compound semiconductor solar cell 100.

In FIG. 1 and the above descriptions, the compound semiconductor solar cell 100 having a single junction structure only including the first photoelectric conversion unit 10 formed of the plurality of compound semiconductor layers 10a, 10b, 10c, 10d, and 10e having the base layer 10c formed of a GaInP layer is shown and described. However, embodiments of the invention are not limited thereto. The compound semiconductor solar cell 100 may include another photoelectric conversion unit including another base layer formed of a different material different from a material of the base layer 10c of the first photoelectric conversion unit 10, along with the first photoelectric conversion unit 10. That is, the compound semiconductor solar cell 100 may have a multi junction structure, which will be described with reference to FIG. 2.

Figure 2:
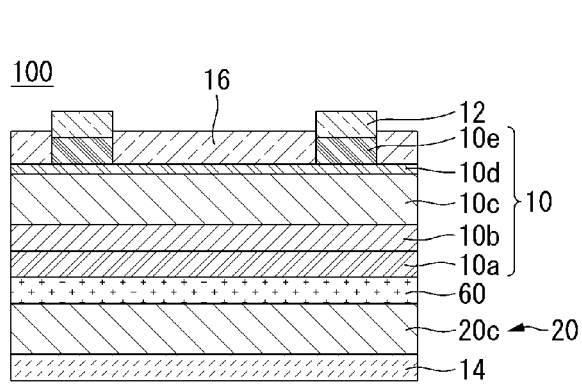
FIG. 2 is cross-sectional views schematically showing various other examples of compound semiconductor solar cells according to embodiments of the invention.
Figure 2:
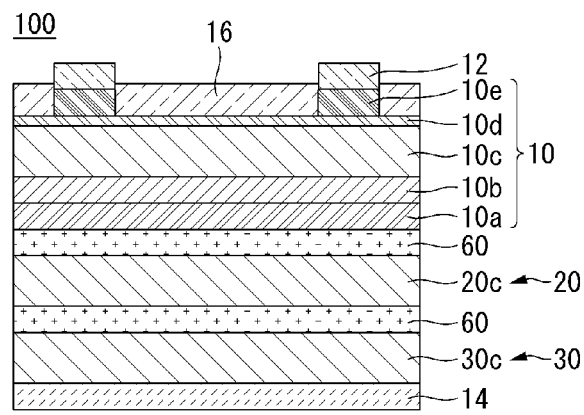
Figure 2:
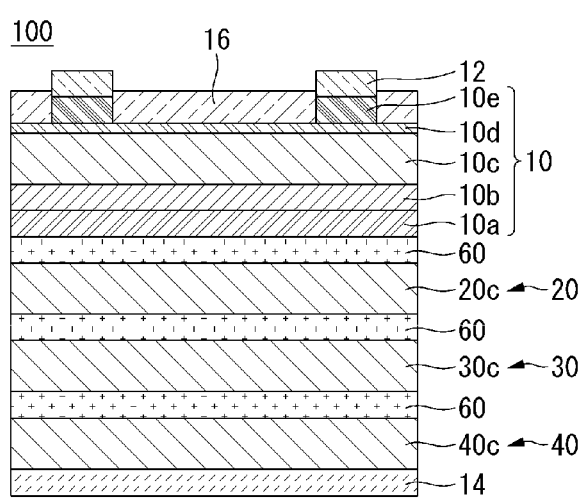
Figure 2:
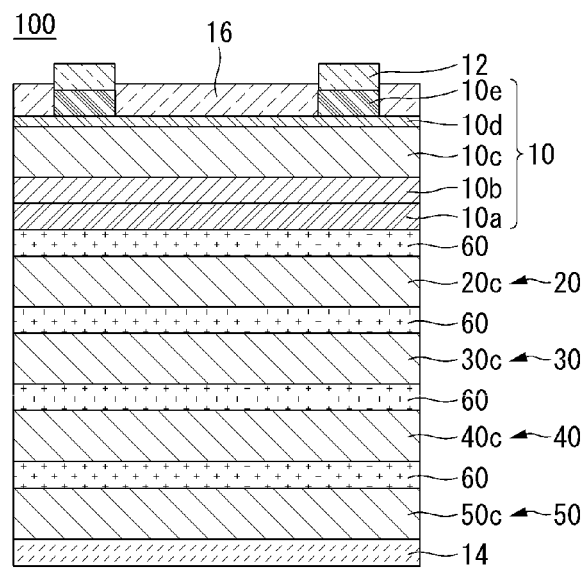

FIG. 2 is cross-sectional views schematically showing various other examples of compound semiconductor solar cells according to embodiments of the invention. For simplicity and clarity, in FIG. 2, only base layers 20c, 30c, 40c and 50c are shown for other photoelectric conversion units except for the first photoelectric conversion unit 10 shown in FIG. 1, that is, second to fifth photoelectric conversion units 20, 30, 40, and 50. Each of the second to fifth photoelectric conversion units 20, 30, 40, and 50 may be formed of a plurality of compound semiconductor layers, and various known structures may be applied thereto.

As shown in FIG. 2(a), a compound semiconductor solar cell 100 may have a double junction structure including a first photoelectric conversion unit 10 and a second photoelectric conversion unit 20. Alternatively, as shown in FIG. 2(b), a compound semiconductor solar cell 100 may have a triple junction structure including a first photoelectric conversion unit 10, a second photoelectric conversion unit 20, and a third photoelectric conversion unit 30. Alternatively, as shown in FIG. 2(c), a compound semiconductor solar cell 100 may has a quadruple junction structure including a first photoelectric conversion unit 10, a second photoelectric conversion unit 20, a third photoelectric conversion unit 30, and a fourth photoelectric conversion unit 40. Alternatively, as shown in FIG. 2(d), a compound semiconductor solar cell 100 may have a quintuple junction structure including a first photoelectric conversion unit 10, a second photoelectric conversion unit 20, a third photoelectric conversion unit 30, a fourth photoelectric conversion unit 40, and a fifth photoelectric conversion unit 50. Also, a compound semiconductor solar cell may have various other multi junction structures.

In the embodiment, the first photoelectric conversion unit 10 may be positioned adjacent to the first electrode 12 (for example, positioned closest to the front surface of the compound semiconductor solar cell 100), and the second photoelectric conversion unit 20, the third photoelectric conversion unit 30, the fourth photoelectric conversion unit 40, and the fifth photoelectric conversion unit 50 may be sequentially positioned toward the second electrode 14. The energy band gaps of the base layers 20c, 30c, 40c, and 50c are gradually lowered as it goes the second photoelectric conversion unit 20, the third photoelectric conversion unit 30, the fourth photoelectric conversion unit 40, and the fifth photoelectric conversion unit 50. Then, the first photoelectric conversion unit 10 having the base layer 10c having a high energy band gap absorbs light of a short wavelength and performs photoelectric conversion, and the second photoelectric conversion unit 20, the third photoelectric conversion unit 30, the fourth photoelectric conversion unit 40, and the fifth photoelectric conversion unit 50 may absorb lights having gradually increased wavelength and perform photoelectric conversion. As a result, photoelectric conversion can be performed using light of various wavelengths, and thus, the efficiency of the compound semiconductor solar cell 100 can be greatly improved.

Tunnel junction layers 60, which electrically connect the photoelectric conversion units 10, 20, 30, 40, and 50, may be located between two adjacent ones of the plurality of photoelectric conversion units 10, 20, 30, 40 and 50. Various materials known as the tunnel junction layer 60 may be used for the tunneling layer 60, and the tunneling layer 60 may include a compound semiconductor layer of group III and V elements. Then, the tunnel junction layer 60 can be easily formed in a process of forming the plurality of photoelectric conversion units 10, 20, 30, 40, and 50. For example, the tunnel junction layer 60 may include an aluminum-gallium-arsenic (AlGaAs) layer having a p-type dopant, a gallium-indium-phosphorus (GaInP) layer having an n-type dopant, or the like. However, embodiments of the invention are not limited thereto.

The second to fifth photoelectric conversion units 20, 30, 40, and 50 (particularly, the base layers 20c, 30c, 40c, and 50c included therein) may have any of various materials in consideration of the band gap.

For example, in the double junction structure shown in FIG. 2(a), the base layer 20c of the second photoelectric conversion unit 20 may be a gallium-arsenic (GaAs) layer. In the triple junction structure as shown in FIG. 2(b), the base layer 20c of the second photoelectric conversion unit 20 may be a gallium-arsenic (GaAs) layer or a gallium-indium-arsenic (GaInAs) layer, and the base layer 30c of the third photoelectric conversion unit 30 may be a germanium (Ge) layer. In the quadruple junction structure shown in FIG. 2(c), the base layer 20c of the second photoelectric conversion unit 20 may be an aluminum-gallium-arsenic (AlGaAs) layer or an aluminum-gallium-indium-arsenic (AlGaInAs) layer, the base layer 30c of the third photoelectric conversion unit 30 may be a gallium-arsenic (GaAs) layer or a gallium-indium-arsenic (GaInAs) layer, and the base layer 40c of the fourth photoelectric conversion unit 40c may be a germanium (Ge) layer. In the quintuple junction structure shown in FIG. 2(d), the base layer 20c of the second photoelectric conversion unit 20 may be an aluminum-gallium-indium-arsenic (AlGaInAs) layer, and the base layer 30c of the third photoelectric conversion unit 30 may be a gallium-indium-arsenic (GaInAs) layer, the base layer 40c of the fourth photoelectric conversion unit 40 may be a gallium-indium-nitrogen-arsenic (GaInNAs) layer, and the base layer 50c of the fifth photoelectric conversion unit 50 may be a germanium (Ge) layer. However, embodiments of the invention are not limited thereto.

A method of manufacturing a compound semiconductor solar cell 100 according to the embodiment of the invention may be applied to forming of the first photoelectric conversion unit 10. Hereinafter, for clarity and simplicity, a method of manufacturing a compound semiconductor solar cell 100 having a single junction structure as shown in FIG. 1 will be described with reference to FIGS. 3A to 3H. However, the method of manufacturing the compound semiconductor solar cell 100 according to the invention is not limited to the single junction structure, but may be applied to a case where the compound semiconductor solar cell 100 having a multi junction structure is formed. It may also be applied to form at least one of the second to fifth photoelectric conversion units 20, 30, 40, and 50.

Figure 3A:
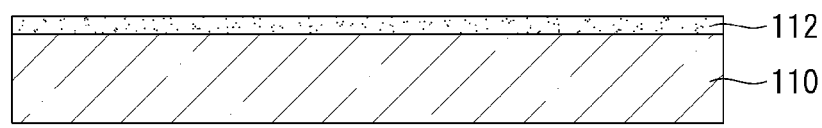
FIGS. 3A to 3H are cross-sectional views showing a method of manufacturing a compound semiconductor solar cell according to an embodiment of the invention.

FIGS. 3A to 3H are cross-sectional views showing a method of manufacturing a compound semiconductor solar cell according to an embodiment of the invention As shown in FIG. 3A, a substrate 110 having a release layer (or a sacrifice layer) 112 formed on one surface thereof is prepared. The substrate 110 may be formed of a compound containing a group IV element, group III and V elements, and group II and VI elements. For example, the substrate 110 may be formed of a silicon (Si) substrate, a germanium (Ge) substrate, a gallium-arsenic compound (GaAs) substrate, or the like. In particular, in the embodiment, the substrate 110 may be a GaAs substrate.

The release layer 112 is etched after a growth of a first photoelectric conversion unit 100 (see FIG. 3B) is completed to separate the substrate 110 and the first photoelectric conversion unit 10. The release layer 112 may be formed by any of various processes and may include any of various materials that can be released by an epitaxial lift off (ELO) process. For example, the release layer 112 may be formed of AlGaAs layer/InAlAs layer, an InGaAs layer, an AlAs layer, an InGaP layer, an InAlP layer, an InGaAlAs layer, an InP layer, or the like.

Figure 3B:
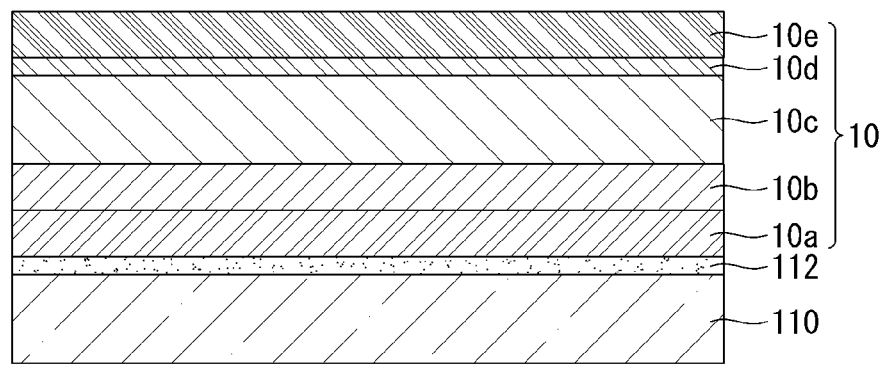

Next, as shown in FIG. 3B, a first photoelectric conversion unit 10 formed of a plurality of compound semiconductor layers 10a, 10b, 10c, 10d, and 10e is formed on the release layer 112. In the embodiment, the plurality of compound semiconductor layers 10a, 10b, 10c, 10d, and 10e may include a base layer 10c formed of a compound semiconductor of a group III element and a group V element. As described in the above, the base layer 10c may be formed of a GaInP layer. In this instance, the plurality of compound semiconductor layers 10a, 10b, 10c, 10d, and 10e may be entirely formed without a pattern.

More specifically, as described above, in the embodiment, the plurality of compound semiconductor layers 10a, 10b, 10c, 10d, and 10e constituting the first photoelectric conversion unit 10 may include a back surface field layer 10a, an emitter layer 10b, a base layer 10c, a window layer 10d, and a contact layer 10e. In a process of forming of the plurality of compound semiconductor layers 10a, 10b, 10c, 10d, and 10e, the back surface field layer 10a, the emitter layer 10b, the base layer 10c, the window layer 10d, and the contact layer 10e may be sequentially formed. Then, the plurality of compound semiconductor layers 10a, 10b, 10c, 10d, and 10e can be stably formed. In this instance, as described above, some layers may not be formed or another layer may be additionally formed.

The plurality of compound semiconductor layers 10a, 10b, 10c, 10d and 10e may be formed by any of various methods, such as, a metal organic chemical vapor deposition (MOCVD) process, a molecular beam epitaxy (MBC) process, or the like. As an example, a metal organic chemical vapor deposition process may be used. That is, the substrate 110 is mounted in a metal organic chemical vapor deposition apparatus heated to a constant deposition temperature, and a plurality of kinds of reaction gases, such as reactive gas including elements constituting each of the plurality of compound semiconductor layers 10a, 10b, 10c, 10d, and 10e, and a gas including an n-type dopant or a p-type dopant, are supplied to a chamber. Then, the plurality of compound semiconductor layer 10a, 10b, 10c, 10d, and 10e formed of a desired material can be formed. In this instance, the plurality of compound semiconductor layers 10a, 10b, 10c, 10d, and 10e can be formed by a simple process by changing a kind, an amount, and the like of the reaction gases supplied in the deposition process.

In the embodiment, at least one of a process-temperature change period TR and a growth-rate change period VI may be included in the process of forming of the plurality of compound semiconductor layers 10a, 10b, 10c, 10d, and 10e.

In the embodiment, since the back surface field layer 10a, the emitter layer 10b, the base layer 10c, the window layer 10d, and the contact layer 10e are sequentially formed, the process-temperature change period TR may be formed of a process-temperature decreasing period in which a process temperature is decreased, and the growth-rate changing period VI may be formed of a growth-rate increasing period in which a growing rate is increased.

When the base layer 10c is formed of a compound semiconductor of a group III element and a group V element as in the embodiment, if the plurality of compound semiconductor layers 10a, 10b, 10c, 10d, and 10e are formed at the same process temperature to with the same growth rate, a second conductivity type dopant included in the emitter layer 10b may be easily diffused into the base layer 10c and/or the back surface field layer 10e in the process of forming the base layer 10c, the window layer 10d, and/or the contact layer 10e. Then, a doping concentration and a doping profile may not have desired value and shape. Particularly, when the base layer 10c is formed of a compound semiconductor layer including gallium, indium, and phosphorus (for example, a GaInP layer) and including an n-type dopant to have an n-type and the emitter layer 10b includes zinc as the second conductivity type dopant to have a p-type, this problem may seriously occur.

Thus, in the embodiment, by controlling a process temperature (for example, a deposition temperature) and/or a growth rate (for example, a deposition rate), the second conductivity type dopant included in the emitter layer 10b can be prevented from being diffused into other layer. That is, by lowering the process temperature in the forming of the base layer 10c, the window layer 10d, and/or the contact layer 10e performed after the forming of the emitter layer 10b, the second conductivity type dopant included in the emitter layer 10b can be prevented from being diffused. Also, by increasing the growth rate in the forming of the base layer 10c, the window layer 10d, and/or the contact layer 10e performed after the forming of the emitter layer 10b, a process time can be reduced, and thus, the second conductivity type dopant included in the emitter layer 10b can be prevented from being diffused. This will be described in more detail.

In the process of forming the plurality of compound semiconductor layers 10a, 10b, 10c, 10d, and 10e, a process temperature of a final process (a process of forming the uppermost layer of the first photoelectric conversion unit 10 to be positioned adjacent to the first electrode 12) may be lower than a process temperature of an initial process (a process of forming the lowermost layer of the first photoelectric conversion unit 10 to be positioned adjacent to the second electrode 14) by the process-temperature change period TR. And/or, a growth rate of a final process (a process of forming the uppermost layer of the first photoelectric conversion unit 10 to be positioned adjacent to the first electrode 12) may be greater than a growth rate of an initial process (a process of forming the lowermost layer of the first photoelectric conversion unit 10 to be positioned adjacent to the second electrode 14) by the growth-rate change period VI.

Alternatively, a process of forming the first conductivity type semiconductor layers 10c, 10d, and 10e may include a period having a process temperature lower than a process temperature of the second conductivity type semiconductor layers 10a and 10b by the process-temperature change period TR. And/or, a process of forming the first conductivity type semiconductor layers 10c, 10d, and 10e may include a period having a growth rate greater than a growth rate of the second conductivity type semiconductor layers 10a and 10b by the growth-rate change period VI.

Alternatively, the process temperature in the forming of the base layer 10c, the window layer 10d, and/or the contact layer 10e may be lower than the process temperature in the forming of the emitter layer 10b, and/or the growth rate of forming of the base layer 10c, the window layer 10d, and/or the contact layer 10e may be greater than the growth rate of forming of the emitter layer 10b.

The process-temperature change period TR may be performed once or a plurality of times during the process of forming the plurality of compound semiconductor layers 10a, 10b, 10c, 10d, and 10e, and may have any of various types of decreasing the process temperature. This will be described in more detail with reference to FIG. 4 together with FIG. 3B.

Figure 4:
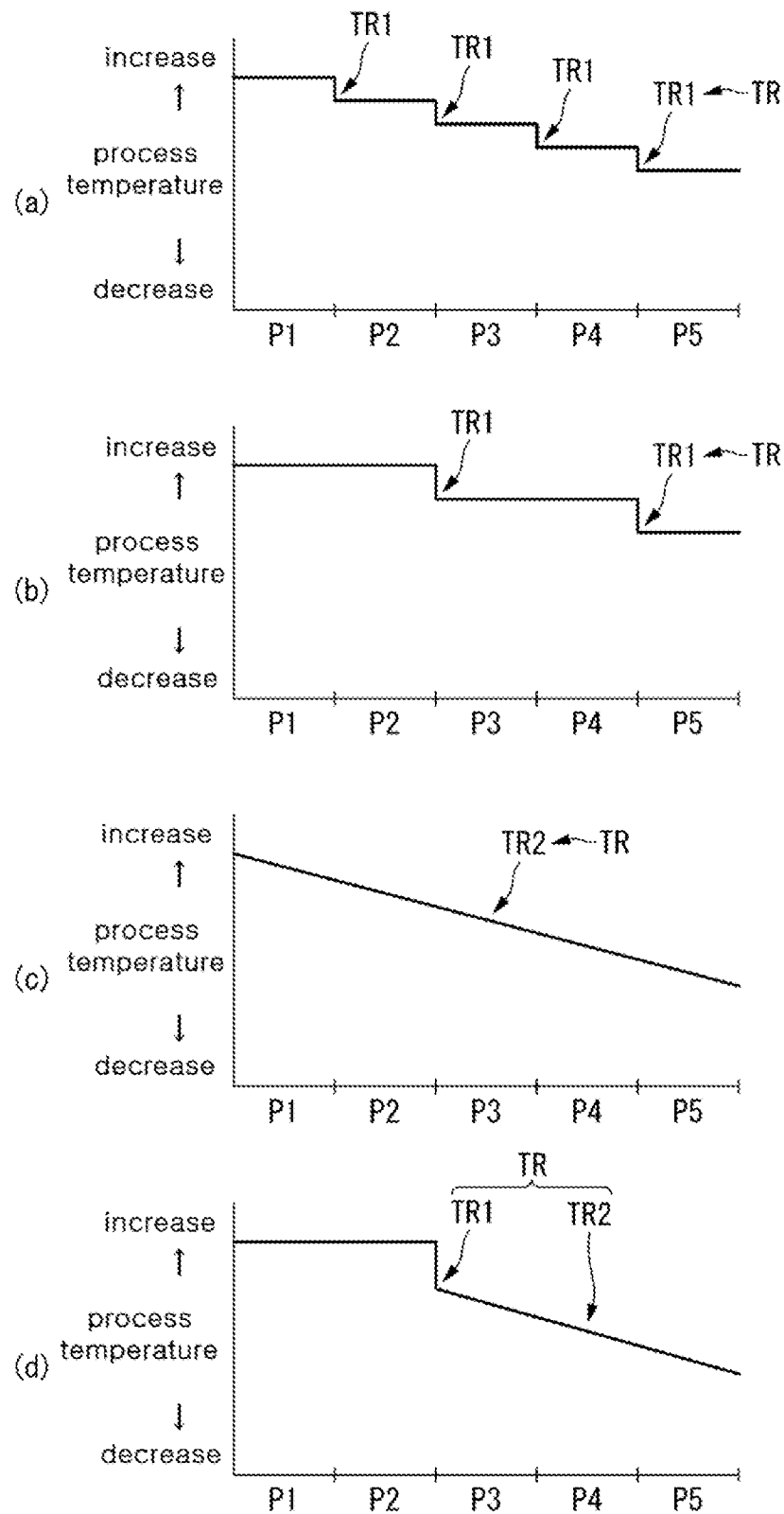
FIG. 4 is a graph showing various examples of changing a process temperature in a process of forming a plurality of compound semiconductor layers in a method of manufacturing a compound semiconductor solar cell according to an embodiment of the invention.

FIG. 4 is a graph showing various examples of changing a process temperature in the process of forming the plurality of compound semiconductor layers in the method of manufacturing the compound semiconductor solar cell according to the embodiment of the invention.

In the process of forming the plurality of compound semiconductor layers 10a, 10b, 10c, 10d and 10e in the embodiment, a first process P1 of forming a back surface field layer 10a, a second process P2 of forming an emitter layer 10b, a third process P3 of forming a base layer 10c, a fourth process P4 of forming a window layer 10d, and a fifth process P5 of forming a contact layer 10e may be sequentially performed. Although widths in an x-axis of the respective processes P1, P2, P3, P4 and P5 are shown to be the same in FIG. 4 for clarity and simplicity, process times of the respective processes P1, P2, P3, P4, and P5 may be varied according to thicknesses, deposition rates, or the like of the compound semiconductor layers 10a, 10b, 10c, 10d, and 10e.

In this instance, as shown in (a) of FIG. 4, a process-temperature change period TR exists at each of boundaries between adjacent two processes of the first to fifth processes P1, P2, P3, P4, and P5. The process-temperature change period TR may be formed of a stepwise decreasing portion TR1 in which a process temperature is stepwisely decreased.

When each of process-temperature change periods TRs exists at each of boundaries between adjacent two processes of the first to fifth processes P1, P2, P3, P4 and P5, a process temperature may be continuously decreased in a stepwise manner in an order of the first process P1, the second process P2, the third process P3, the fourth process P4, and the fifth process P5. Thus, the diffusion of the second conductivity type dopant included in the emitter layer 10b can be effectively prevented. The process temperature is uniformly maintained in each of the first to fifth processes P1, P2, P3, P4, and P5 by the stepwise decreasing portion TR1, and thus, properties of the compound semiconductor layers 10a, 10b, 10c, 10d, and 10e can be uniformly maintained. However, embodiments of the invention are not limited thereto.

Therefore, as shown in (b) of FIG. 4, a process-temperature change period TR exists at a part of boundaries between adjacent two processes of the first to fifth processes P1, P2, P3, P4, and P5. For example, the process-temperature change period TR may exist at a boundary between the second process P2 of forming the emitter layer 10b and the third process P3 of forming the base layer 10c. Then, the diffusion of the second conductivity type dopant included in the emitter layer 10b can be effectively prevented by decreasing the process temperature after the second process P2 of forming the emitter layer 10b. Also, the process-temperature change period TR may exist at a boundary between the fourth process P4 of forming the window layer 10d and the fifth process P5 of forming the contact layer 10e. Then, the diffusion of the second conductivity type dopant included in the emitter layer 10b can be effectively prevented.

For example, the process-temperature change period TR may not exist at a boundary between the first process P1 of forming the back surface field layer 10a including the second conductivity type dopant and the second process P2 of forming the emitter layer 10b including the same second conductivity type dopant. Thus, the process can be simplified by reducing a number of process-temperature change periods TRs. The process-temperature change period TR may not be provided between the third process P3 of forming the base layer 10c and the fourth process P4 of forming the window layer 10d. Since the window layer 10d is thin, it is advantageous in the process when the process-temperature change period TR may not be provided between the third process P3 of forming the base layer 10c and the fourth process P4 of forming the window layer 10d. However, embodiments of the invention are not limited thereto, and the process-temperature change period TR may exist once or more times at the boundaries between adjacent two processes of the first to fifth processes P1, P2, P3, P4, and P5.

Alternatively, as shown in (c) of FIG. 4, a process-temperature change period TR includes a gradual decreasing portion TR2 in which a process temperature gradually decreases. According to this, it is not necessary to abruptly change the process temperature, and a burden of the process time and the like can be reduced. In (c) of FIG. 4, for example, it is disclosed that the process temperature gradually decreases by the process-temperature change period TR from an initial point of the first process P1 to a final point of the fifth process P5. However, embodiments of the invention are not limited thereto, and the gradual decreasing portion TR2 may exist in at least a part of the first to fifth processes P1, P2, P3, P4, and P5.

Alternatively, as shown in (d) of FIG. 4, a process-temperature change period TR includes both of a stepwise decreasing portion TR1 and a gradual decreasing portion TR2. For example, it is exemplified that the stepwise decreasing portion TR1 exists between the second process P2 and the third process P3 and the gradual decreasing portion TR2 exists from the third process P3 to the fifth process P5. According to this, the process temperature is stepwisely or largely decreased after the second process P2 of forming the emitter layer 10b, and thereafter, is continuously and gradually decreased so that the diffusion of the second conductivity type dopant contained in the emitter layer 10b can be prevented. However, embodiments of the invention are not limited thereto, and the stepwise decreasing portion TR1 and the gradual decreasing portion TR2 may be provided together in any of various forms and in any of various times.

For example, a temperature change from an initial temperature to a final temperature by each of the process-temperature change periods TRs (that is, the stepwise decrease portion TR1 or the gradual decreasing portion TR2) may be 5° C. or more. If the temperature change by the process-temperature change period TR is less than 5° C., a difference between the final temperature and the initial temperature is not large enough to sufficiently realize the effect of a temperature reduction. For example, the temperature change due to each process-temperature change period TR may be 100° C. or less (for example, 50° C. or less). If the temperature change by each process-temperature change period TR exceeds 100° C., a portion where the process temperature is greatly lowered or greatly increased may exist when the plurality of compound semiconductor layers 10a, 10b, 10c, 10d, and 10e are formed, and thus, the compound semiconductor layers 10a, 10b, 10c, 10d, and 10e may not be stably formed. Further, there may be difficulties in changing the process temperature. In particular, the temperature change by each stepwise decreasing portion TR1 may be 50° C. or less. This is because it is difficult to significantly change the process temperature within a predetermined time.

As a result, for example, a process temperature of a final process of forming of the plurality of compound semiconductor layers 10a, 10b, 10c, 10d, and 10e may be lower than a process temperature of an initial process of forming of the plurality of compound semiconductor layers 10a, 10b, 10c, 10d, and 10e by 5° C. or more (for example, 5 to 200° C., as an example, 5 to 100° C.). Alternatively, a process temperature in a process of forming the base layer 10c, the window layer 10d, or the contact layer 10e may be lower than a process temperature in a process of forming the emitter layer by 5° C. or more (for example, 5 to 200° C., as an example, 5 to 100° C.). Then, the diffusion of the second conductivity type dopant included in the emitter layer 10b can be effectively prevented.

The stepwise decreasing portion TR1 or the gradual decreasing portion TR2 may be achieved by any of various methods. The stepwise decreasing portion TR1 may be achieved when a vapor deposition or the like is performed for forming a desired layer in a state where the temperature is reached to a desired process temperature by turning off the heating member and waiting while only a carrier gas or the like is provided until the temperature is reached to a desired process temperature. The gradual decreasing portion TR2 may be achieved when the deposition is performed in a state where the temperature is gradually decreased by turning off the heating member and the like.

Although it is exemplified that the stepwise decreasing portion TR1 exists at the boundary between adjacent two processes of the first to fifth processes P1, P2, P3, P4, and P5 in the above embodiment, the stepwise decreasing portion TR1 may exist at an intermediate portion of at least one of the first to fifth processes P1, P2, P3, P4, and P5. Also, even though it is exemplified that the gradual decreasing portion TR2 may be positioned from an initial portion of one of the first to fifth steps P1, P2, P3, P4, and P5 to a final portion of the one of the first to fifth steps P1, P2, P3, P4, and P5, the gradual decrease portion TR2 may be started and/or ended at an intermediate portion of each of the processes P1, P2, P3, P4, and P5.

For example, the process temperature of forming the base layer 10c may be 600 to 700° C., and the process temperature of forming the emitter layer 10b may be less than the process temperature of forming the base layer 10c by 5° C. or more (for example, 5 to 100° C., as an example, 5 to 50° C.). The process time can be reduced while stably forming the base layer 10c and the emitter layer 10b within this range. However, embodiments of the invention are not limited thereto.

The growth-rate change period VI may be performed once or a plurality of times during the process of forming the plurality of compound semiconductor layers 10a, 10b, 10c, 10d, and 10e, and may have any of various types of increasing the growth rate. This will be described in more detail with reference to FIG. 5 together with FIG. 3B.

Figure 5:
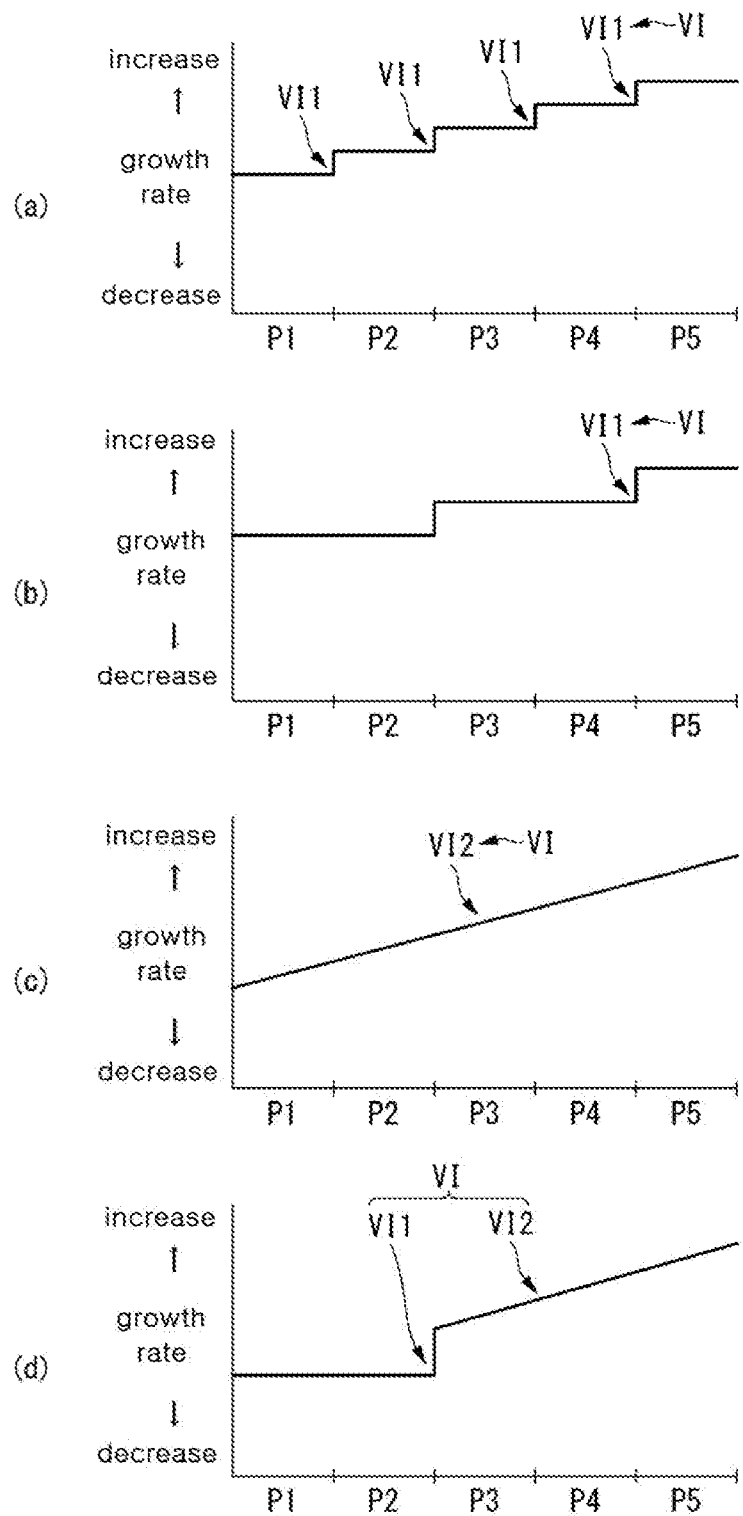
FIG. 5 is a graph showing various examples of changing a growth rate in a process of forming a plurality of compound semiconductor layers in a method of manufacturing a compound semiconductor solar cell according to an embodiment of the invention.

FIG. 5 is a graph showing various examples of changing a growth rate in a process of forming a plurality of compound semiconductor layers in a method of manufacturing a compound semiconductor solar cell according to an embodiment of the invention. Although it is shown than x-axis widths of processes P1, P2, P3, P4 and P5 are the same in FIG. 5 for simplicity and clarity, process times of the processes P1, P2, P3, P4, and P5 may be varied depending on thicknesses, a deposition rate, and the like of the compound semiconductor layers 10a, 10b, 10c, 10d, and 10e.

In this instance, as shown in (a) of FIG. 5, a growth-rate change period VI exists at each of boundaries between adjacent two processes of the first to fifth processes P1, P2, P3, P4, and P5. The growth-rate change period VI may be formed of a stepwise increasing portion VI1 in which a growth rate is stepwisely increased.

When each of growth-rate change periods VIs exists at each of boundaries between adjacent two processes of the first to fifth processes P1, P2, P3, P4 and P5, a growth rate may be continuously increased in a stepwise manner in an order of the first process P1, the second process P2, the third process P3, the fourth process P4, and the fifth process P5. Thus, the diffusion of the second conductivity type dopant included in the emitter layer 10b can be effectively prevented. The growth rate is uniformly maintained in each of the first to fifth processes P1, P2, P3, P4, and P5 by the stepwise increasing portion VI1, and thus, properties of the compound semiconductor layers 10a, 10b, 10c, 10d, and 10e can be uniformly maintained. However, embodiments of the invention are not limited thereto.

Therefore, as shown in (b) of FIG. 5, a growth-rate change period VI exists at a part of boundaries between adjacent two processes of the first to fifth processes P1, P2, P3, P4, and P5. For example, the growth-rate change period VI may exist at a boundary between the second process P2 of forming the emitter layer 10b and the third process P3 of forming the base layer 10c, and thus, the diffusion of the second conductivity type dopant included in the emitter layer 10b can be effectively prevented by increasing the growth rate after the second process P2 of forming the emitter layer 10b. Also, the growth-rate change period VI may exist at a boundary between the fourth process P4 of forming the window layer 10d and the fifth process P5 of forming the contact layer 10e, and thus, the diffusion of the second conductivity type dopant included in the emitter layer 10b can be effectively prevented.

For example, the growth-rate change period VI may not exist at a boundary between the first process P1 of forming the back surface field layer 10a including the second conductivity type dopant and the second process P2 of forming the emitter layer 10b including the same second conductivity type dopant. Thus, the process can be simplified by reducing a number of growth-rate change periods VIs. The growth-rate change period VI may not be provided between the third process P3 of forming the base layer 10c and the fourth process P4 of forming the window layer 10d. Since the window layer 10d is thin, it is advantageous in the process when the window layer 10d is formed without the growth-rate change period VI. However, embodiments of the invention are not limited thereto, and the growth-rate change period VI may exist once or more times at the boundaries between two adjacent processes of the first to fifth processes P1, P2, P3, P4, and P5.

Alternatively, as shown in (c) of FIG. 5, a growth-rate change period VI includes a gradual increasing portion VI2 in which a growth rate gradually increases. According to this, it is not necessary to abruptly change the growth rate, and a burden of the process time and the like can be reduced. In (c) of FIG. 5, for example, it is disclosed that the growth rate is gradually increased by the growth-rate change period VI from an initial portion of the first process P1 to a final portion of the fifth process P5. However, embodiments of the invention are not limited thereto, and the gradual increasing portion VI2 may exist in at least a part of the first to fifth processes P1, P2, P3, P4, and P5.

Alternatively, as shown in (d) of FIG. 5, a growth-rate change period VI includes both of a stepwise increasing portion VI1 and a gradual increasing portion VI2. For example, it is exemplified that the stepwise increasing portion VI1 exists between the second process P2 and the third process P3 and the gradual increasing portion VI2 exists from the third process P3 to the fifth process P5. According to this, the growth rate is stepwisely or largely increased after the second process P2 of forming the emitter layer 10*b*, and thereafter, is continuously and gradually increased so that the diffusion of the second conductivity type dopant contained in the emitter layer 10*b* can be prevented. However, embodiments of the invention are not limited thereto, and the stepwise increasing portion VI1 and the gradual increasing portion VI2 may be provided together in any of various forms and in any of various times.

For example, a growth-rate change from an initial growth-rate to a final growth-rate by each of the growth-rate change periods VIs (that is, the stepwise increase portion VI1 or the gradual increasing portion VI2) may be 0.1 µm/hr or more. If the growth-rate change by the growth-rate change period VI is less than 0.1 µm/hr, a difference between the final growth-rate and the initial growth-rate is not large enough to sufficiently realize the effect of increasing a growth rate. For example, the growth-rate change by each growth-rate change period VI may be 20 µm/hr or less (for example, 10 µm/hr or less). If the growth-rate change by each growth-rate change period VI exceeds 20 µm/hr, a portion where the growth rate is greatly lowered or greatly increased may exist when the plurality of compound semiconductor layers 10*a*, 10*b*, 10*c*, 10*d*, and 10*e* are formed, and thus, the compound semiconductor layers 10*a*, 10*b*, 10*c*, 10*d*, and 10*e* may not be stably formed. Further, there may be difficulties in changing the growth rate. In particular, the growth-rate change by each stepwise increasing portion VII may be 10 µm/hr or less. This is to prevent the growth rate from becoming too large within a certain period of time and deteriorating the properties.

As a result, for example, a growth rate of a final process of forming of the plurality of compound semiconductor layers 10*a*, 10*b*, 10*c*, 10*d*, and 10*e* may be greater than a growth rate of an initial process of forming of the plurality of compound semiconductor layers 10*a*, 10*b*, 10*c*, 10*d*, and 10*e* by 0.1 µm/hr or more (for example, 0.1 to 50 µm/hr, as an example, 0.1 to 20 µm/hr). Alternatively, a growth rate of a process of forming of the base layer 10*c*, the window layer 10*d*, or the contact layer 10*e* may be greater than a growth rate of a process of forming the emitter layer by 0.1 µm/hr or more (for example, 0.1 to 50 µm/hr, as an example, 0.1 to 20 µm/hr). Then, a diffusion of the second conductivity type dopant included in the emitter layer 10*b* can be effectively prevented, and the growth rate of the plurality of compound semiconductor layers 10*a*, 10*b*, 10*c*, 10*d*, and 10*e* can be prevented from becoming excessively large, and thus, the deteriorating of the properties can be prevented.

The stepwise increasing portion VI1 or the gradual increasing portion VI2 may be achieved by any of various methods. For example, the stepwise increasing portion VI1 or the gradual increasing portion VI2 may be achieved by stepwisely or gradually increasing an amount, a concentration, etc. of reactive gases.

Although it is exemplified that the stepwise increasing portion VI1 exits at the boundary between two adjacent processes of the first to fifth processes P1, P2, P3, P4, and P5 in the above embodiment, the stepwise increasing portion VI1 may exist at an intermediate portion of at least one of the first to fifth processes P1, P2, P3, P4, and P5. Also, even though it is exemplified that the gradual increasing portion VI2 may exist from an initial portion of one of the first to fifth steps P1, P2, P3, P4, and P5 to a final portion of the one of the first to fifth steps P1, P2, P3, P4, and P5, the gradual increase portion VI2 may be started and/or ended at an intermediate portion of each of the processes P1, P2, P3, P4, and P5.

For example, the growth rate of the back surface field layer 10*a* and/or the emitter layer 10*b* may be 0.7 µm/hr or more, the growth rate of forming of the base layer 10*c* may be 0.8 µm/hr or more (for example, 1.0 µm/hr or more), the growth rate of forming of the window layer 10*d* may be 1.5 µm/hr or more, and the growth rate of forming of the contact layer 10*e* may be 2.0 µm/hr or more. Also, the growth rate of forming of the back surface field layer 10*a*, the emitter layer 10*b*, the base layer 10*c*, the window layer 10*d*, or the contact layer 10*e* may be 50 µm/hr or less (for example, 20 µm/hr or less, as an example, 10 µm/hr or less). The process time can be reduced while stably forming the base layer 10*c* and the emitter layer 10*b* within this range. However, embodiments of the invention are not limited thereto.

In the embodiment, the base layer 10*c* may be thicker than each of the other compound semiconductor layers (i.e., the back surface field layer 10*a*, the emitter layer 10*b*, the window layer 10*d*, or the contact layer 10*e*). For example, a thickness of the base layer 10*c* may be 400 nm to 1.5 um, and a thickness of the emitter layer 10*d* may be 50 nm to 300 nm. Since the base layer 10*c* is directly related to a photoelectric conversion, the base layer 10*c* may have a sufficient thickness. In this instance, when the growth rate of the base layer 10*c* having a large thickness is greater than the growth rate of the emitter layer 10*b* as in the embodiment, the process time can be effectively reduced.

A thickness of the contact layer 10*e* may be smaller than a thickness of the emitter layer 10*b* or the base layer 10*c*, and may be equal to or greater than a thickness of the window layer 10*d*. For example, a thickness of the contact layer 10*e* may be 30 and 150 nm. By reducing the thickness of the contact layer 10*e* as described above, the process time of the process of forming the contact layer 10*e* can be reduced, thereby preventing the diffusion of the second conductivity type dopant included in the emitter layer 10*b*. For reference, since the window layer 10*d* has a relatively thin thickness (for example, the thinnest thickness) among the plurality of compound semiconductor layers 10*a*, 10*b*, 10*c*, 10*d* and 10*e*, the effect of reducing the process time may be not sufficient if the thickness of the window layer 10*d* is decreased. However, embodiments of the invention are not limited thereto, and the thickness of the contact layer 10*e* may be smaller than the thickness of the window layer 10*d*.

However, embodiments of the invention are not limited thereto. The growth rates, the thicknesses, etc. of the plurality of compound semiconductor layers 10*a*, 10*b*, 10*c*, 10*d*, and 10*e* are not limited to the above-described range.

In the embodiment, the process-temperature change period TR and the growth-rate change period VI may be provided together. In this instance, the process-temperature change period TR and the growth-rate change period VI may exist in the same process or between the same processes, or may exit in different processes or between different processes. A form in change (for example, a gradual change, a stepwise change, etc.) of the process-temperature change period TR and the growth-rate change period VI may be the same or different from each other.

Alternatively, only the process-temperature change period TR may be provided and the growth-rate change period VI may be not provided. In this case, the growth rate of the emitter layer 10b and that of the base layer 10c may be the same, or the growth rates of the initial process and the final process may be the same.

Alternatively, only the growth-rate change period VI may be provided and the process-temperature change period TR may be not provided. In this case, the process temperatures of the initial process and the final process may be the same or the process temperatures of the emitter layer 10b and the base layer 10c may be the same.

In the embodiment, it is exemplified that the process temperature is uniformly maintained or decreases from the initial process toward the final process and/or the growth rate is uniformly maintained or increases from the initial process toward the final process. According to this, the effect of the embodiment can be achieved more stably. However, embodiments of the invention are not limited thereto, and a part where the process temperature increases or a part where the growth rate decreases during the process may be partially provided.

When the plurality of compound semiconductor layers 10a, 10b, 10c, 10d, and 10e have another layer other than the above-described layers, the another layer may have the same process temperature and/or the same growth rate as the adjacent layer, or may have a process temperature between process temperatures of two adjacent layers and/or a growth rate between growth rates of two adjacent layers to improve the stability and simplify the process. For example, when a buffer layer is formed between the emitter layer 10b and the base layer 10c, a process temperature of forming the buffer layer may be equal to the process temperature of forming the emitter layer 10b, may be equal to the process temperature of forming the base layer 10b, or may have a value between the process temperature of forming the emitter layer 10b and the process temperature of forming the base layer 10c. And/or, a growth rate of forming the buffer layer may be equal to the growth rate of forming the emitter layer 10b, may be equal to the growth rate of forming the base layer 10b, or may have a value between the growth rate of forming the emitter layer 10b and the growth rate of forming the base layer 10c.

In the embodiment, it is exemplified that the process-temperature change period TR is formed of a process-temperature decreasing period in which the process temperature decreases, and the growth-rate change period VI is formed of a growth-rate increasing period in which the growth rate increases. This is because the first photoelectric conversion unit 10 is formed by sequentially forming the back surface field layer 10a, the emitter layer 10b, the base layer 10c, the window layer 10d, and the contact layer 10e. That is, when the compound semiconductor solar cell 100 has a multi junction structure, another photoelectric conversion unit is firstly formed on the substrate 110, and then, a plurality of layers of the first photoelectric conversion unit 10 is formed by the above method. In this case, there is no difference in lattice constant between the substrate 110 and another photoelectric conversion unit disposed thereon, or the lattice constant difference between the substrate 110 and another photoelectric conversion unit is smaller than the lattice constant difference between the substrate 110 and the first photoelectric conversion unit 10. However, embodiments of the invention are not limited thereto. Therefore, the first photoelectric conversion unit 10 may be formed by sequentially forming the contact layer 10e, the window layer 10d, the base layer 10c, the emitter layer 10b, and the back surface field layer 10a. In this case, the process-temperature change period TR may be formed of a process-temperature increasing period in which the process temperature increases, and the growth-rate change period VI may be formed of a growth-rate decreasing period in which the growth rate decreases.

According to the embodiment, a plurality of compound semiconductor layers 10a, 10b, 10c, 10d, and 10e having a doping concentration and a doping profile as designed can be formed. This will be described in detail with reference to FIGS. 6 to 8.

Figure 6:
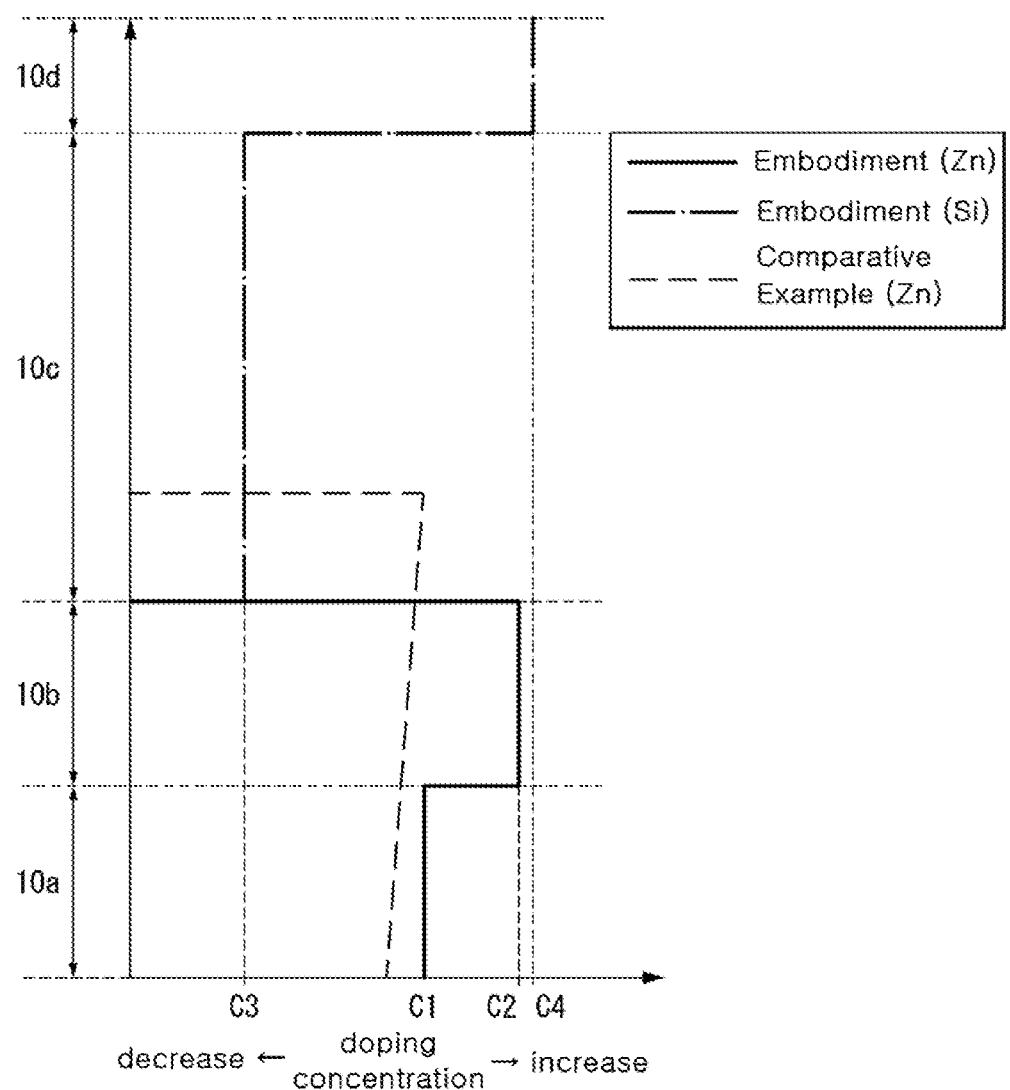
FIG. 6 is a graph schematically showing doping concentrations of photoelectric conversion units of compound semiconductor solar cells according to Embodiment of the invention and Comparative Example.

FIG. 6 is a graph schematically showing doping concentrations of photoelectric conversion units of compound semiconductor solar cells according to Embodiment of the invention and Comparative Example. FIG. 6 shows only a doping concentration of a first conductivity type dopant and a doping concentration of a second conductivity type dopant in a back surface field layer 10a, an emitter layer 10b, a base layer 10c, and a window layer 10d for simplicity. For example, zinc (Zn) is used for the second conductivity type dopant and silicon (Si) is used for the first conductivity type dopant. In this instance, a process temperature and/or a growth rate were controlled as described above in Embodiment of the invention, while the process temperature and the growth rate were kept constant or similarly maintained (that is, less than 5° C. and less than 0.1 μm/hr) in Comparative Example.

Referring to FIG. 6, in Embodiment, a doping concentration of a second conductivity type dopant (i.e., zinc) is a relatively low as a first doping concentration C1 in a back surface field layer 10a, is stepwisely increased to have a step between the back surface field layer 10a and the emitter layer 10b, is higher than the first doping concentration C1 as a second doping concentration C2 in the emitter layer 10b, and is decreased to a value determined to be not doped so as to have a step. As a result, the doping concentration of the second conductivity type dopant is stepwisely decreased increased from the back surface field layer 10a to the emitter layer 10b, and then, is stepwisely decreased with a large step from the emitter layer 10b to the base layer 10c, and thus, the dopant concentration is determined to be not doped in the base layer 10c. Differences of the doping concentration of the second conductivity type dopant between the back surface field layer 10a and the emitter layer 10b and between the emitter layer 10b and the base layer 10c are clear, and the emitter layer 10b has a sufficiently high doping concentration of the second conductivity type dopant as the second doping concentration C2. It can be seen from this that the second conductivity type dopant included in the emitter layer 10b is not diffused into the back surface field layer 10a and the base layer 10c.

In Embodiment, a doping concentration of a first conductivity type dopant (i.e., silicon) has a value determined to be not doped in the back surface field layer 10a and the emitter layer 10b, is stepwisely increased to have a step between the emitter layer 10b and the base layer 10c, is a third doping concentration C3 in the base layer 10c, is stepwisely increased to have a step between the base layer 10c and the window layer 10d, and then, is higher than the third doping concentration C3 as a fourth doping concentration C4 in the window layer 10d.

Here, "a doping concentration is stepwisely increased" may mean that the doping concentration is increased twice or more. For example, the second doping concentration C2 may be at least twice the first doping concentration C1, and the fourth doping concentration C4 may be at least twice the third doping concentration C3.

In FIG. 6, it is exemplified that the third doping concentration C3 is less than the first doping concentration C1. However, embodiments of the invention are not limited thereto. Therefore, the third doping concentration C3 may be equal to or greater than the first doping concentration C1.

For example, the second doping concentration C2 of the emitter layer 10b may be in a range from $1\times10^{17}/cm^3$ to $1\times10^{18}/cm^3$, and the first doping concentration C1 of the back surface field layer 10a may be may be $5\times10^{17}/cm^3$ or less (for example, $5\times10^{16}/cm^3$ to $5\times10^{17}/cm^3$). The third doping concentration C3 of the base layer 10c may be in a range from $1\times10^{17}/cm^3$ to $1\times10^{18}/cm^3$. These doping concentrations are limited to values suitable for serving as each of layers, but embodiments of the invention are not limited thereto.

In this instance, the second conductivity type dopant is doped in the emitter layer 10b as the second doping concentration C2, while the doping concentration of the second conductivity type dopant of the base layer 10c is a value determined to be not doped (for example, less than $1\times10^{16}/cm^3$). Thus, the second doping concentration C2 of the second conductivity type dopant of the emitter layer 10b is at least 10 times (for example, 100 times or more) of the doping concentration of the second conductivity type dopant of the base layer 10c.

On the other hand, in Comparative Example, the doping concentration of the second conductivity type dopant in the back surface field layer 10a and the emitter layer 10b is lower than the first doping concentration C1 as a whole, and a difference in the doping concentration of the second conductivity type dopant between the back surface field layer 10a and the emitter layer 10b is not clear. Since the doping concentration of the emitter layer 10b has a value lower than the designed value, fill factor and open-circuit voltage of the compound semiconductor solar cell 100 may decrease and efficiency of the compound semiconductor solar cell 100 may be lowered. In addition, the second conductivity type dopant is diffused to a portion designed as the base layer 10c, and thus, a part of a portion designed as the base layer 10c actually functions as the emitter layer 10b. Then, the second conductivity type dopant of the emitter layer 10b is diffused into the back surface field layer 10a and the base layer 10c, and thus, properties of a pn junction between the emitter layer 10b and the base layer 10c maybe deteriorated or a position of the pn junction may be varied. As a result, the efficiency of the compound semiconductor solar cell 100 may be further lowered.

Figure 7:
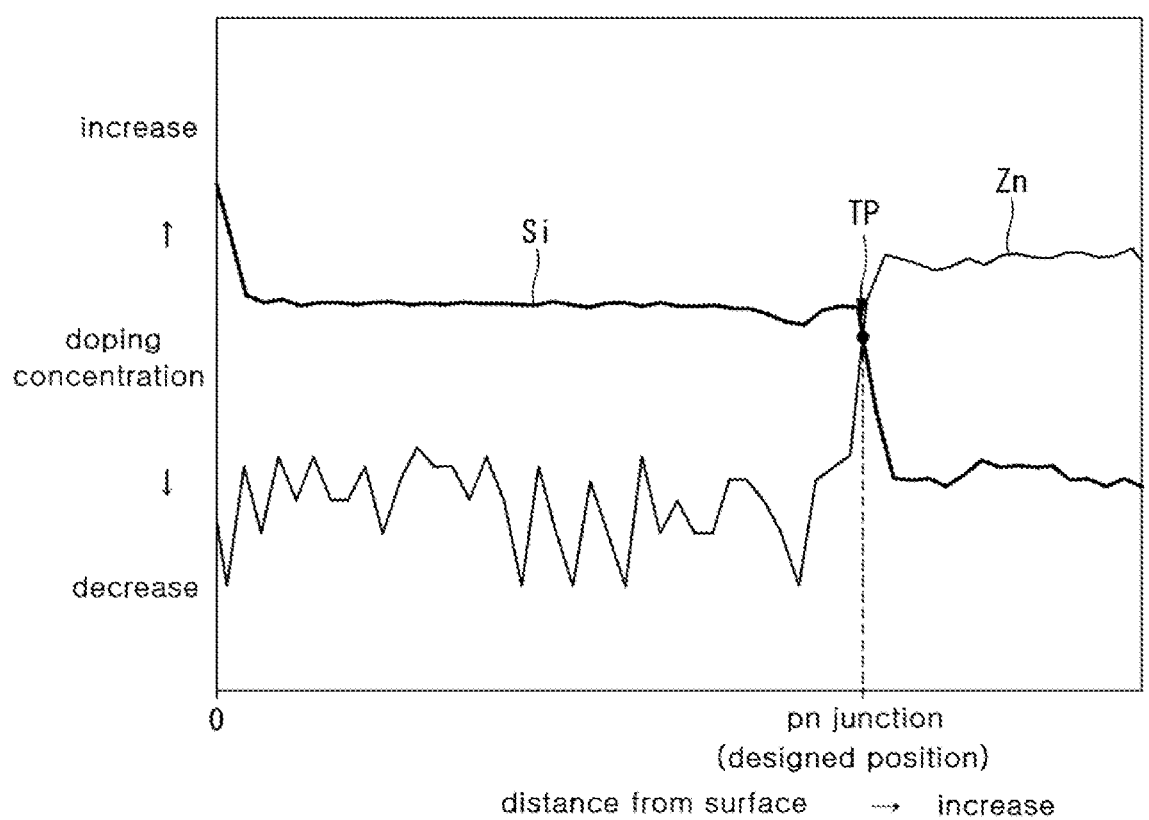
FIG. 7 is a graph showing doping concentrations measured according to a distance from a surface of a first photoelectric conversion unit of a compound semiconductor solar cell according to Embodiment of the invention by using secondary ion mass spectrometry (SIMS).
Figure 8:
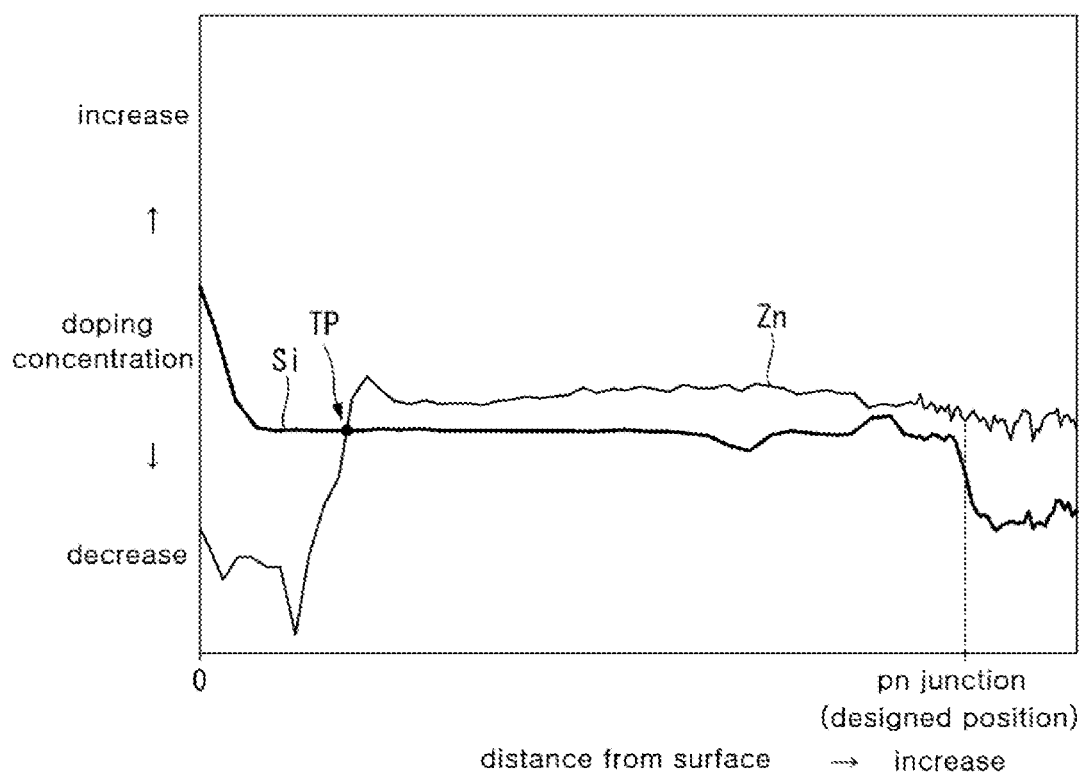
FIG. 8 is a graph showing doping concentrations measured according to a distance from a surface of a first photoelectric conversion unit of a compound semiconductor solar cell according to Comparative Example of the invention by using secondary ion mass spectrometry.

FIG. 7 is a graph showing doping concentrations measured according to a distance from a surface of a first photoelectric conversion unit of a compound semiconductor solar cell according to Embodiment of the invention by using secondary ion mass spectrometry (SIMS). FIG. 8 is a graph showing doping concentrations measured according to a distance from a surface of a first photoelectric conversion unit of a compound semiconductor solar cell according to Comparative Example of the invention by using secondary ion mass spectrometry. In this instance, the surface of the first photoelectric conversion unit is a front surface of the compound semiconductor solar cell 100, that is, a surface on which the contact layer 10e is located. As the distance from the surface of the first photoelectric conversion unit increases, the window layer 10d, the base layer 10c, the emitter layer 10b, and the back surface field layer 10a are sequentially positioned.

Referring to FIG. 7, in Embodiment, a portion TP (that is, the actual pn junction) in which a doping concentration of silicon that is a first conductivity type dopant and a doping concentration of zinc that is a second conductivity type dopant are reversed exists at a designed position. That is, it can be seen that the pn junction is actually formed at the designed position of the pn junction.

On the other hand, referring to FIG. 8, in Comparative Example, a portion TP (that is, the actual pn junction) in which a doping concentration of silicon that is a first conductivity type dopant and a doping concentration of zinc that is a second conductivity type dopant are reversed exists at a portion to be adjacent to the surface of the first photoelectric conversion unit away from the designed portion of the pn junction. It can be seen that zinc, which is the second conductivity type dopant, is diffused toward the surface of the first photoelectric conversion unit to have a different doping concentration and a different doping profile from the designed value. For example, in Comparative Example, the actual pn junction may be shifted to the surface side by about 10 nm to 1 μm as compared with the designed portion of the pn junction. As a result, the efficiency of the compound semiconductor solar cell may be lowered.

Figure 3C:
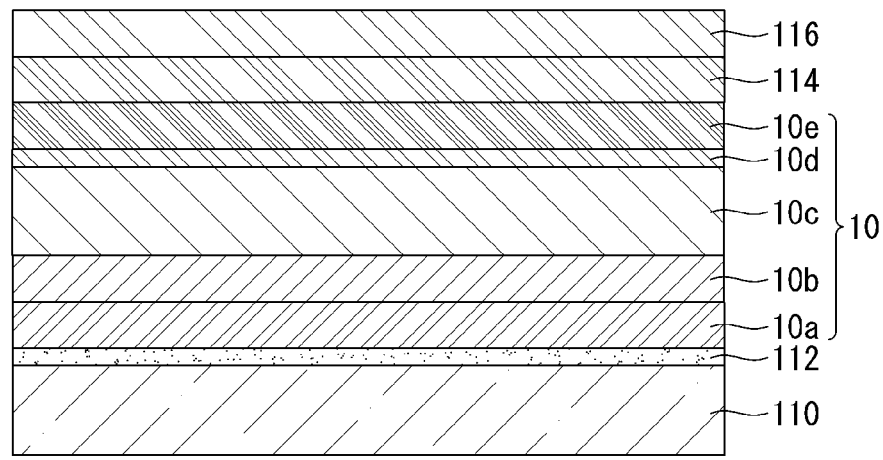

Next, as shown in FIG. 3C, a protective metal layer 114 is formed on the contact layer 10e, and a first lamination film 116 is attached thereon. The protective metal layer 114 may be formed of any of various materials having corrosion resistance to an etching solution used in an epitaxial lift-off process (a process shown in FIG. 3D). The first lamination film 116 may be formed of any of various materials that serve to support the first photoelectric conversion unit 10. In one example, the protective metal layer 114 may be formed of copper. The first lamination film 116 may include a support substrate and an adhesive layer disposed thereon. As the support substrate, polyethylene terephthalate (PET) may be used. As the adhesive layer, ethylene vinyl acetate (EVA) may be used. However, embodiments of the invention are not limited to the material of the protective metal layer 114 and the first lamination film 116.

Figure 3D:
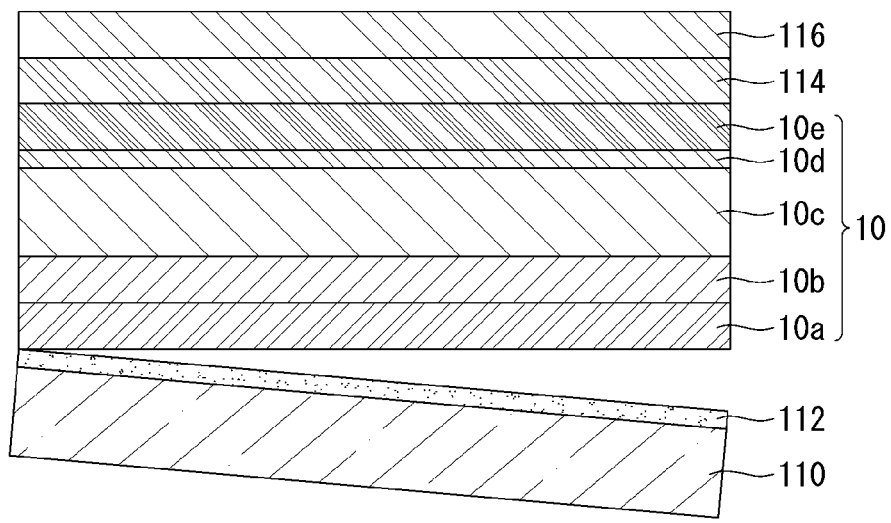

Next, as shown in FIG. 3D, the release layer 112 is etched by an epitaxial lift-off process so that the substrate 110 is separated from the compound semiconductor layers 10a, 10b, 10c, 10d, and 10e, the protective metal layer 114, and the first lamination film 116. Any of various etching solutions (for example, a hydrofluoric acid solution) and the like known as the etching of the release layer 112 may be used.

Figure 3E:
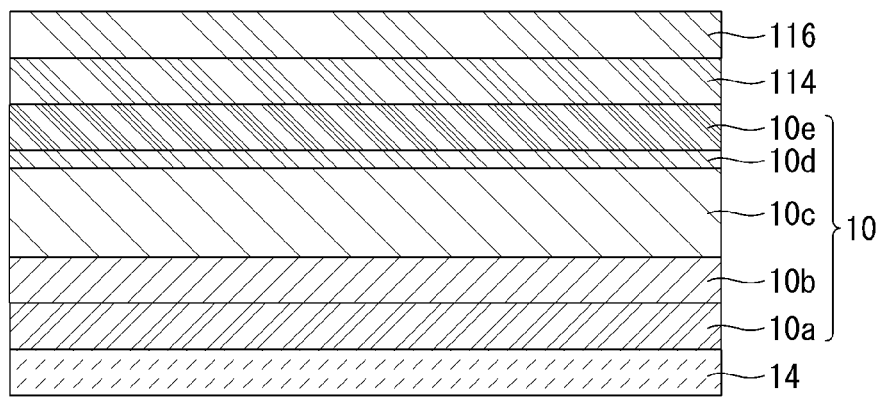

Next, as shown in FIG. 3E, a second electrode 14 is formed on a back surface of the first photoelectric conversion unit 10 exposed by removing the substrate 110. Any of various methods known for forming the second electrode 14 may be applied.

Figure 3F:
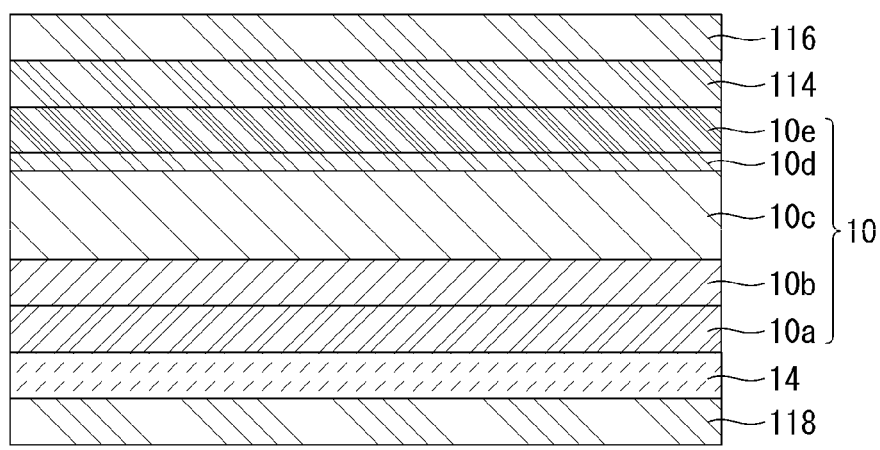

Next, as shown in FIG. 3F, a second lamination film 118 is attached on the second electrode 14. The second lamination film 118 may be formed of any of various materials that serve to support the first photoelectric conversion unit 10. The second lamination film 118 may include a support substrate and an adhesive layer disposed thereon. Polyethylene terephthalate (PET) may be used as the support substrate, and ethylene vinyl acetate (EVA) may be used as the adhesive layer.

Figure 3G:
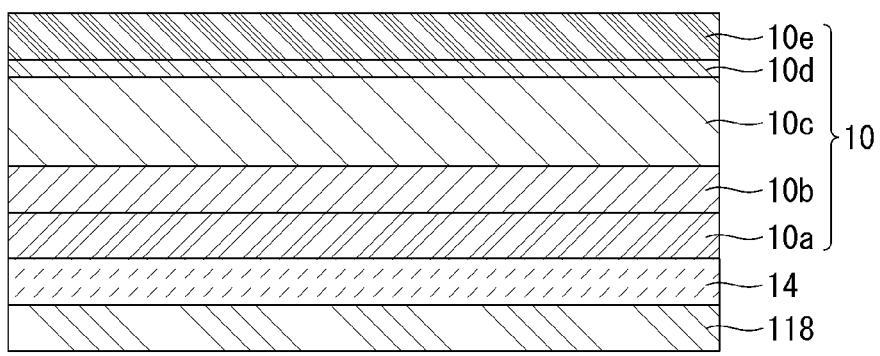

Next, as shown in FIG. 3G, the first lamination film 116 and the protective metal layer 114 are removed. Any of various methods known as the method of removing the first lamination film 116 and the protective metal layer 114 may be applied.

Figure 3H:
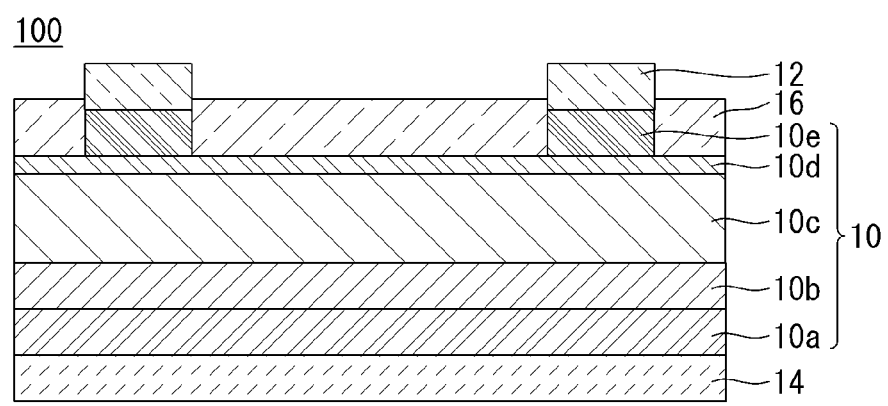

Next, as shown in FIG. 3H, a first electrode 12 and an anti-reflection layer 16 are formed, the contact layer 10e is patterned, the second lamination film 118 is removed, and a manufacture of the compound semiconductor 100 is completed.

More specifically, the first electrode 12 may be formed, the contact layer 10e is patterned by etching a part of the contact layer 10e to have a predetermined pattern corresponding to the first electrode 12 through using the first electrode 12 as a mask. The anti-reflection layer 16 is formed on at least a portion of the window layer 10e exposed by removing the contact layer 10e. Any of various methods known as a method of forming the first electrode 12 and the anti-reflection layer 16 and a method of removing the second lamination film 118 may be applied.

According to the method of manufacturing the compound semiconductor solar cell 100, by controlling the process temperature and/or the growth rate in the process of forming the first photoelectric conversion unit 10 (or the plurality of compound semiconductor layers 10a, 10b, 10c, 10d, and 10e), the first photoelectric conversion unit 10 can be formed to have a desired doping concentration and a desired doping profile. As a result, the compound semiconductor solar cell 100 including the first photoelectric conversion unit 10 has excellent open-circuit voltage and a high fill factor, and thus, can have high efficiency.

In the above description, the method of manufacturing the compound semiconductor solar cell 100 shown in FIG. 1 is exemplified, but embodiments of the invention are not limited thereto. As shown in FIG. 2(a) to (d), in the method of manufacturing the compound semiconductor solar cell 100 having a multi junction structure, processes of other photoelectric conversion units 20, 30, 40, 50 are formed on the substrate 110 and tunnel junction layers 60 may be performed first in order, and then, the first photoelectric conversion unit 10 may be formed. According to such a regular growth method, when the first photoelectric conversion unit 10 is formed, the process-temperature change period TR is formed of a process-temperature decreasing period in which the process temperature is decreased, and the growth-rate change period VI is formed of a growth-rate increasing period in which the growth rate is increased.

However, embodiments of the invention are not limited thereto. According to an inverse growth method, the first photoelectric conversion unit 10 is formed, and then, other photoelectric conversion units 20, 30, 40, 50 and tunnel junction layers 60 may be formed in order. In this case, when the first photoelectric conversion unit 10 is formed, the process-temperature change period TR is formed of a process-temperature increasing period in which the process temperature is increased, and a growth-rate change period VI is formed of a growth-rate decreasing period in which the growth rate is decreased.

In this instance, each of the base layers 20c, 30c, 40c and 50c of the other photoelectric conversion units 20, 30, 40 and 50 may include at least one of a gallium-arsenic compound (GaAs), a gallium-indium-arsenic compound (GaInAs), a gallium-indium-nitrogen-arsenic compound (GaInNAs), an aluminum-gallium-arsenic compound (AlGaAs), an aluminum-gallium-indium-arsenic compound (AlGaInAs), and germanium (Ge). Any of various known methods may be applied for forming the other photoelectric conversion units 20, 30, 40, 50 and the tunnel junction layers 60.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:

1. A method of manufacturing a compound semiconductor solar cell, the method comprising:
    forming a plurality of compound semiconductor layers of at least two elements, the plurality of compound semiconductor layers including a base layer and an emitter layer, the base layer including an n type dopant to have an n type and the emitter layer including a p type dopant to have a p type,
    wherein the forming of the plurality of compound semiconductor layers includes at least one of a process-temperature change period and a growth-rate change period,
    wherein the forming of the plurality of compound semiconductor layers comprises:
        forming a p type semiconductor layer including the emitter layer and having the p type; and
        forming an n type semiconductor layer on the p type semiconductor layer,
    wherein the n type semiconductor layer includes the base layer and has the n type, and
    wherein the forming of the n type semiconductor layer includes a period having a processing temperature lower than a processing temperature of the forming of the p type semiconductor layer, or a process temperature to form the base layer is lower than a process temperature to form the emitter layer.

2. The method of claim 1, wherein at least one of the base layer and the emitter layer comprises a compound semiconductor layer including gallium (Ga), indium (In) and phosphorus (P) as one of the at least two elements.

3. The method of claim 1, wherein the process-temperature change period comprises a process-temperature decreasing period in which a process temperature decreases.

4. The method of claim 1, wherein the forming of the plurality of compound semiconductor layers includes a plurality of processes including an initial process and a final process, and
    wherein a process temperature of the final process is lower than a process temperature of the initial process.

5. The method of claim 3, wherein the process-temperature change period comprises at least one of a stepwise decreasing portion in which the process temperature is stepwisely decreased and a gradual decreasing portion in which the process temperature is gradually decreased.

6. The method of claim 3, wherein the process-temperature change period includes a plurality of process-temperature change periods, and a temperature change by each of the plurality of process-temperature change periods is 5° C. or more.

7. The method of claim 1, wherein the growth-rate change period comprises a growth-rate increasing period in which a growth rate increases.

8. The method of claim 1, wherein the forming of the plurality of compound semiconductor layers includes a plurality of processes including an initial process and a final process, and wherein a growth rate of the final process is greater than a growth rate of the initial process.

9. The method of claim 7, wherein the forming of the n type semiconductor layer includes a period having a growth rate greater than a growth rate in the forming of the p type semiconductor layer; or wherein a growth rate to form the base layer is lower than a growth rate to form the emitter layer.

10. The method of claim 9, wherein a thickness of the base layer is greater than a thickness of the emitter layer.

11. The method of claim 9, wherein the forming of the n type semiconductor layer comprises:

forming the base layer; and forming a contact layer on the base layer, wherein the contact layer is formed of a material different from a material of the base layer, and wherein the contact layer is thinner than the base layer or has a thickness of 30 to 150 nm.

12. The method of claim 7, wherein the growth-rate change period includes a plurality of growth-rate change periods, and wherein a growth-rate change by each of the plurality of growth-rate change periods is 0.1 μm/hr or more.

13. The method of claim 7, wherein the growth-rate change period comprises at least one of a stepwise increasing portion in which the growth rate is stepwisely increased and a gradual increasing portion in which the growth rate is gradually increased.

14. The method of claim 1, wherein the base layer has the n-type, wherein the base layer comprises a gallium-indium-phosphorous (GaInP) layer, and wherein the emitter layer comprises a gallium-indium-phosphorus (GaInP) layer or an aluminum-gallium-indium-phosphorus (AlGaInP) layer.

15. The method of claim 1, further comprising, before the forming of the plurality of compound semiconductor layers:

forming another photoelectric conversion unit; and forming a tunnel junction layer on the another photoelectric conversion unit, wherein the compound semiconductor solar cell has a multi-junction structure.

* * * * *